(12) United States Patent
Cheong et al.

(10) Patent No.: US 7,853,905 B1
(45) Date of Patent: Dec. 14, 2010

(54) PERFORMING EARLY DFT-AWARE PROTOTYPING OF A DESIGN

(75) Inventors: Kit Lam Cheong, Palo Alto, CA (US); Ping-Chih Wu, Cupertino, CA (US); Weibin Ding, Shanghai (CN); Louis Liu, Shanghai (CN); Yiqun Ding, Shanghai (CN)

(73) Assignee: Cadence Design Systems, Inc., San Jose, CA (US)

( * ) Notice: Subject to any disclaimer, the term of this patent is extended or adjusted under 35 U.S.C. 154(b) by 297 days.

(21) Appl. No.: 11/965,700

(22) Filed: Dec. 27, 2007

(51) Int. Cl.
*G06F 17/50* (2006.01)

(52) U.S. Cl. .................. 716/4; 716/1; 716/8; 716/11; 714/724

(58) Field of Classification Search ............. 716/4–6, 716/1, 8, 11; 714/724
See application file for complete search history.

(56) References Cited

U.S. PATENT DOCUMENTS

| | | | |
|---|---|---|---|
| 6,651,235 B2 | 11/2003 | Dai et al. | |
| 6,836,872 B2 * | 12/2004 | Abdennadher | 716/4 |
| 7,603,643 B2 | 10/2009 | McCracken et al. | |
| 2005/0228616 A1 * | 10/2005 | Huang et al. | 702/181 |
| 2007/0245285 A1 | 10/2007 | Wang et al. | |

OTHER PUBLICATIONS

Milder, P. et al, "Fast and Accurate Resource Estimation of Automatically Generated Custom DFT IP Cores," FPGA '06, Feb. 22-24, 2006, Monterey, California, USA.

Larsson, E. et al, "Power-Aware Test Planning in the Early System-on-Chip Design Exploration Process", IEEE Transactions on Computers, vol. 55, No. 2, pp. 227-239 Feb. 2006.

Gebotys, C. et al, "VLSI Design Synthesis with Testability", 25th ACM/IEEE Design Automation Conference, paper 3.3, pp. 16-21, 1988.

Davis, W. et al, "A Design Environment for High-Throughput Low-Power Dedicated Signal Processing Systems", IEEE Journal of Solid State Circuits, vol. 37, No. 3, pp. 420-431, Mar. 2002.

Chien, C.-D. et al, "Design and realisation of a new hardware efficient IP core for the 1-D discrete Fourier transform", IEEE Proc.-Circuits Devices Syst., vol. 152, No. 3, pp. 247-258, Jun. 2005.

Catthoor, F., "Energy-delay efficient data storage and transfer architectures: circuit technology versus design methodology solutions", Proceedings of Design, Automation and Test in Europe, pp. 709-714, Feb. 1998.

(Continued)

*Primary Examiner*—Thuan Do
*Assistant Examiner*—Nha T Nguyen
(74) *Attorney, Agent, or Firm*—Vista IP Law Group LLP

(57) ABSTRACT

The present invention relates to performing early design for testing (DFT)-aware prototyping of a design. Unlike prior approaches, the improvement analyzes and considers the impact of test structures at a very early stage of the design process. This allows test structures to be considered and addressed in a more efficient iterative and incremental way, which reduces design cycle time and reduces costs.

15 Claims, 7 Drawing Sheets

OTHER PUBLICATIONS

Larsson, E. et al, "The design and optimization of SOC test solutions", IEEE/ACM International Conference on Computer Aided Design, pp. 523-530, Nov. 2001.

Ayala-Rincon, M. et al, "Modeling a Reconfigurable System for Computing the FFT in Place via Rewriting-Logic", Proc. SBCCI, 2003.

Khan, M. and Madisetti, V., "System Design and Re-Engineering Through Virtual Prototyping: A Temporal Model-Based Approach", Asilomar Conference on Signals Systems, 1998.

Kaul, M. and Vemuri, R. "Design-Space Exploration for Block-Processing Based Temporal Partitioning of Run-Time Reconfigurable Systems," Journal of VLSI Signal Processing Systems 24, 181-209, 2000, Kluwer Academic Publishers.

Tangelder, R.J.W.T, et al, "Test Synthesis for data paths in VLIW-based processors", Proceedings of the 11th Workshop on Test Technology, 1999.

Sudarsan, R. et al, "Design for Tolerance of Electro-Mechanical Assemblies", Proceedings of the 1998 IEEE International Conference on Robotics & Automation, Belgium, May 1998.

Papachristou, C. et al, "A Data Path Synthesis method for Self-Testable Designs", 28th ACM/IEEE Design Automation Conference, paper 23.3, pp. 378-384, 1991.

Lee, H. et al, "Exploring the Interplay of Yield, Area, and Performance in Processor Caches", Proceedings of the IEEE International Conference on Computer Design, Oct. 2007.

* cited by examiner

PERFORMING EARLY DFT-AWARE PROTOTYPING OF A DESIGN

FIELD OF THE INVENTION

The invention relates to Integrated Circuit (chip) design.

BACKGROUND

The design and manufacture of electronic circuits involve many stages each utilizing many tools and strategies. The electronic circuit is first designed and planned in an architectural design stage. The designers plan the architecture of the design of the electronic circuit. This design architecture can be implemented into high-level logic of the desired functions of the electronic circuit. Then, the design is modeled using a programming language such as registered transfer language (RTL), hardware description language (HDL), etc. Then, the modeled designs are synthesized into a layout of the electronic circuit. At this stage, the layout is analyzed and improvements are made if required in an attempt to ensure the quality of the resulting electronic circuit. After the layout is complete, optimization may be performed on the layout. After the optimization step, the design is manufactured. The manufactured electronic circuit may be further analyzed and tested, and improvements of the design and/or manufacturing process may be made from the test results.

In conventional electronic design automation (EDA) design flows and tools, design for testing (DFT) structures are placed into the electronic circuit after the architectural design stage of the electronic circuit. For example, many EDA tools design and implement DFT structures during the synthesis stage by performing DFT synthesis. With this approach, test structures are synthesized along with other design components during the synthesis stage. The synthesized test structures would then get sent to a place and route tool to perform physical design and layout of the DFT structures. Analysis would then be performed to determine the impact of the test structures upon the design. Any problems due to the test structures are then addressed and corrected with re-synthesis and/or additional layout changes and placement corrections of the test structures.

The problem with this approach is that consideration of the impact of the test structures happens at a very late stage of the design process. If a need to correct any problems resulting from the test structures arises, then a considerable amount of time and cost is expended to correct those problems. In addition, a significant quantity of the existing design may be needed to change or correct the problems arising from the additional test structures.

SUMMARY

The embodiments provide a method and system for performing early design for testing (DFT)-aware prototyping of a design.

In one embodiment, a method, system or computer readable medium for early design for testing (DFT) prototyping includes identifying logic associated with the early DFT prototyping of an electronic design. The logic is translated into test structures for a layout design. The test structure is analyzed for its impact upon the layout design. The result of the analysis is provided.

In another embodiment, abstraction of the testing structure provides DFT models to the dataflow diagrams. In another embodiment, the DFT prototyping comprises performing an abstraction of the test structure. In another embodiment, the abstraction includes translating a test structure into a plurality of parameters and strategies based on type, intent, complexity and/or details associated with the test structure. In another embodiment, the translating further includes extracting relevant parameters and mapping the parameters against the test structure. In another embodiment, the analyzing is performed in the architectural planning stage of the circuit design.

DETAILED DESCRIPTION

The embodiments provide a method, system and computer program product for performing early design for testing (DFT)-aware prototyping of a design. Unlike prior approaches, the present embodiments analyze and consider the impact of test structures at a very early stage of the design process (i.e., during the architectural planning/design stage). This early prototyping allows the affects of test structures on the electronic design to be considered and addressed in a more efficient iterative and incremental way than the prior approaches, which reduces design cycle time and reduces costs.

Figure 1:
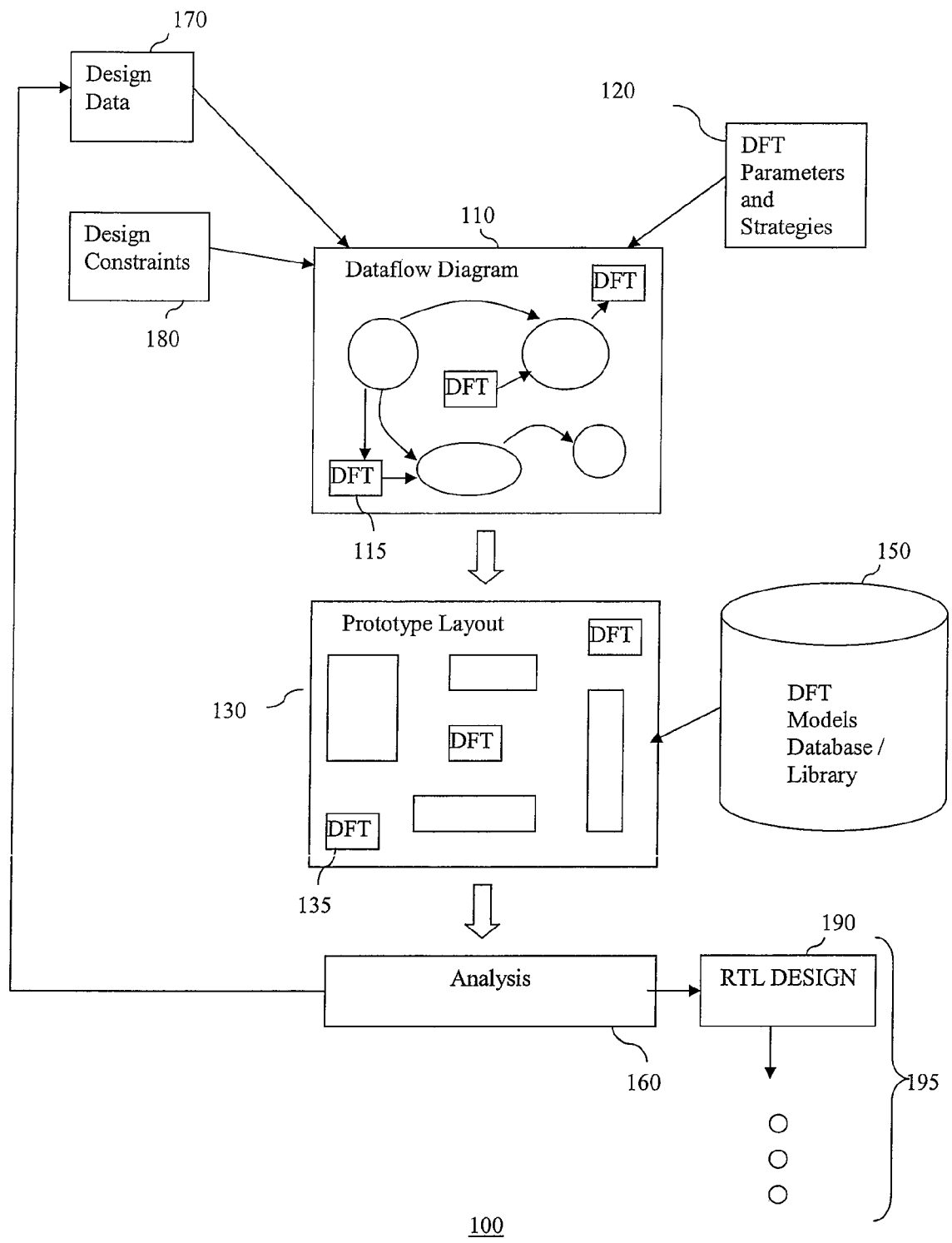
FIG. 1 depicts an architectural flow overview according to an embodiment of the present invention.

FIG. 1 depicts an architectural flow overview for an architectural design stage DFT prototyping of an electronic design. The architectural flow overview 100 includes a flow diagram 110 including at least one DFT object 115, a DFT parameters and strategies 120, design data 170, design constraints 180, a prototype layout 130 including at least one prototype DFT cell block 135 and analysis 160.

The dataflow diagram 110 substantially corresponds to the design logic of the electronic design. The dataflow diagram 110 includes relationships between the components of an electronic design. This relationship may be determined using DFT parameters and strategies 120, design data 170 and design constraint 180 of the components. The analysis may be performed by partitioning and analyzing the components of the electronic design, and then mapping of the design logic to the components. In one embodiment, the components are anticipated components that might be included in the prototype layout 130. The components may include design blocks of electronic designs as well as multiple DFT objects 115. The components may include, for example, old designs, new designs, and black box designs. The old designs have probably already been through synthesis so information should be fairly accurate. The new designs may include general information that the designer may include such as the dimension, shape, etc. A black box design may be, for example, designs from the intellectual property of another vender. The DFT objects are instantiated in the dataflow diagram and their information may include parameters that are used to customize the prototype DFT models. The DFT objects are design logic for the test structures that are included with the logic of the electronic circuits. In some embodiments, the information may be a modifier for the properties of the model. For example, the object may include parameters that double the prototype DFT model's area and/or increase the routing porosity by 20%. When the components are analyzed, the DFT objects allow the test structures to be included with the analysis of the components of the electronic design.

From the dataflow diagram 110, a prototype layout may be generated 130. The generated prototype layout includes prototype DFT model blocks 135 that are automatically included by translating the DFT object into the prototype layout when the dataflow 110 is translated. The prototype DFT models database/library 150 provides the prototype DFT models that may be retrieved and/or analyzed to place the prototype DFT design in the prototype layout. The prototype DFT model may be a circuit layout design of the DFT that may be directly inserted into the prototype layout. The prototype DFT model may also include, for example, information such as properties and sub-models of the prototype DFT models. Utilizing the parameters from the DFT object, the properties of the model may be used to customize the DFT cell to create the desired DFT cell for placing in the prototype layout. For example, the prototype DFT model that is stored in the prototype DFT models database/library 150 may include information such as the area, density, dimension, input/output, power consumption, timing model and routing porosity of the DFT. Each prototype DFT model includes a standard list of properties that described the DFT cell as a model. In order to translate and place the DFT cell in the prototype layout using the model, the DFT object parameters may be used to customize the model using the parameters to create the desired DFT cell for the prototype layout.

After analysis 160, any improvements and changes may be performed to the prototype layout by modifying the dataflow diagram with design data 170, design constrains 180, and/or DFT parameters and strategies 120. By improving the prototype layout with DFT prototyping, the floor plan layout, when created, will have fewer issues than floor plan layouts with later inserted DFT's. After all the desired improvements and changes are made to the dataflow diagram/prototype layout, the architectural design may then be models at the RTL design stage 190. At this stage 190, the design may be programmed using conventional languages such as RTL, HDL, verilog, etc. After this stage, additional conventional EDA process 195 may be used to manufacture the electronic design.

In some embodiments, the resulting prototype layout is analyzed 160 and verified as to the impact of the test structures. Examples of certain types of analysis may include IR drop analysis, silicon virtual prototyping (SVP), timing analysis, congestion analysis, area analysis and exploration. In some embodiments, the results of this analysis are provided as feedback to improve the design of the electronic device.

Figure 2:
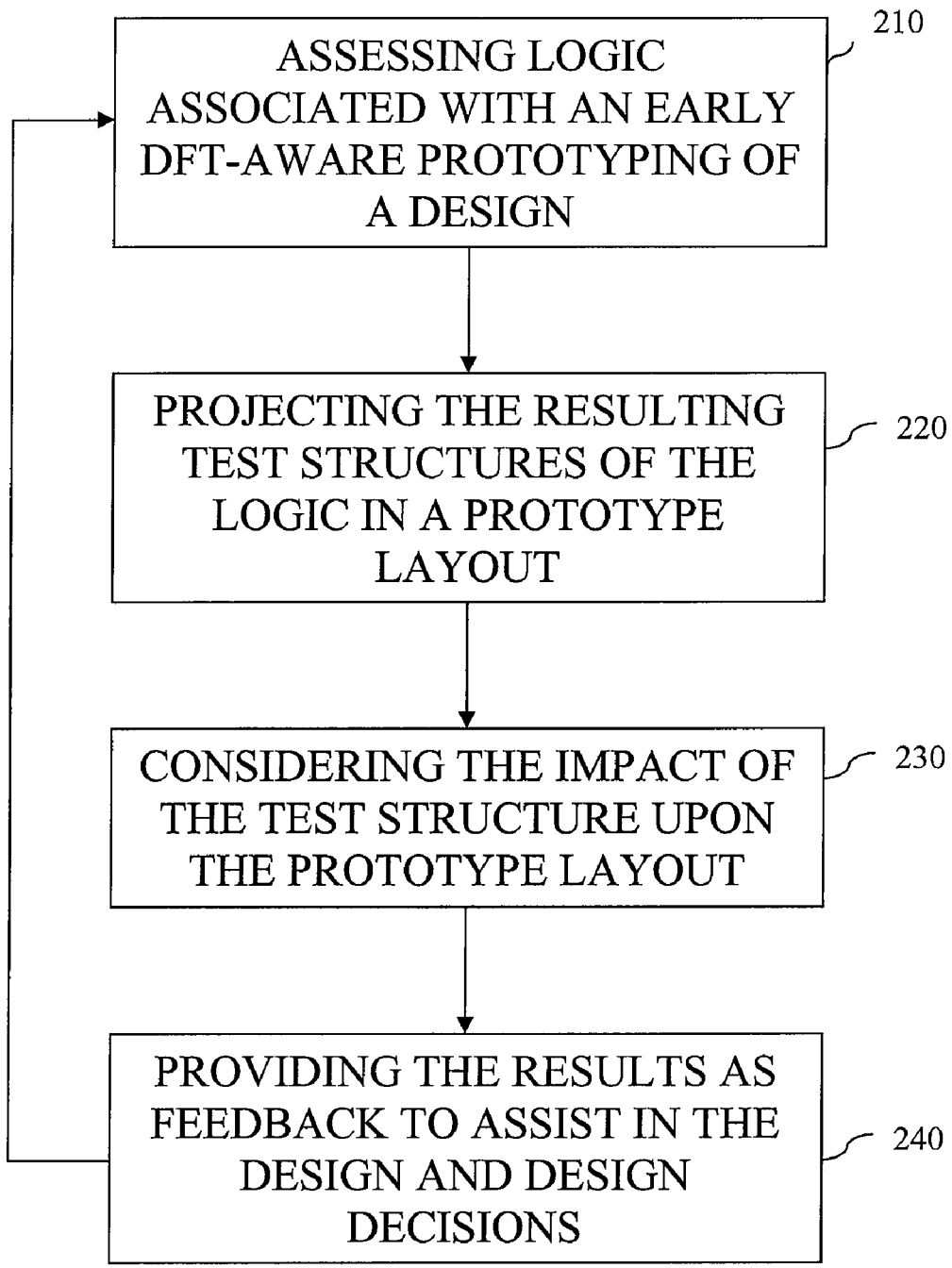
FIG. 2 illustrates a flow diagram according to an embodiment of the present invention.

FIG. 2 illustrates a flow diagram 200 of the general overview of FIG. 1 according to an embodiment of the present invention. In one embodiment, the logic associated with the test structure design is identified and translated into test structures to be placed within the prototype layout. The impact of the test structures upon the prototype layout may be analyzed.

In one embodiment, logic associated with an early DFT-aware prototyping of a test structure design is assessed 210. The logic of the design is analyzed and relationships between the logic are determined. In one embodiment, the logic includes properties of the DFT object 115. In another embodiment, the properties include information such as the area, density, dimension, input/output, power consumption, timing model and routing porosity of the DFT. In a further embodiment, the DFT objects utilizes parameter and strategies that may be stored in a local database/library. In another embodiment, the database/library may be located and/or accessed remotely by the EDA system.

The resulting test structures of the logic are projected in a prototype layout 220. In one embodiment, the test structures are calculated, translated and inserted into the prototype layout using information from the prototype DFT cell database/library 150. Because the location and couplings of the test structures have already been anticipated and designed into the dataflow diagram, there is no need to include margins for the floor plan layout. There is also little need for additional rearrangement of the layout design in order to insert and place the test structures.

Then, the impact of the test structures upon the prototype layout is determined 230. In some embodiments, the impact is considered by using a verification process of the layout design. Any verification tool(s) may be used in determining the impact of the test structures.

Then, the results of the impact may be provided as feedback to assist in the design and design decisions 240. The results may give the designers additional information about the quality and validity of the design. This process allows for earlier feedback into the design and design decisions.

Figure 3A:
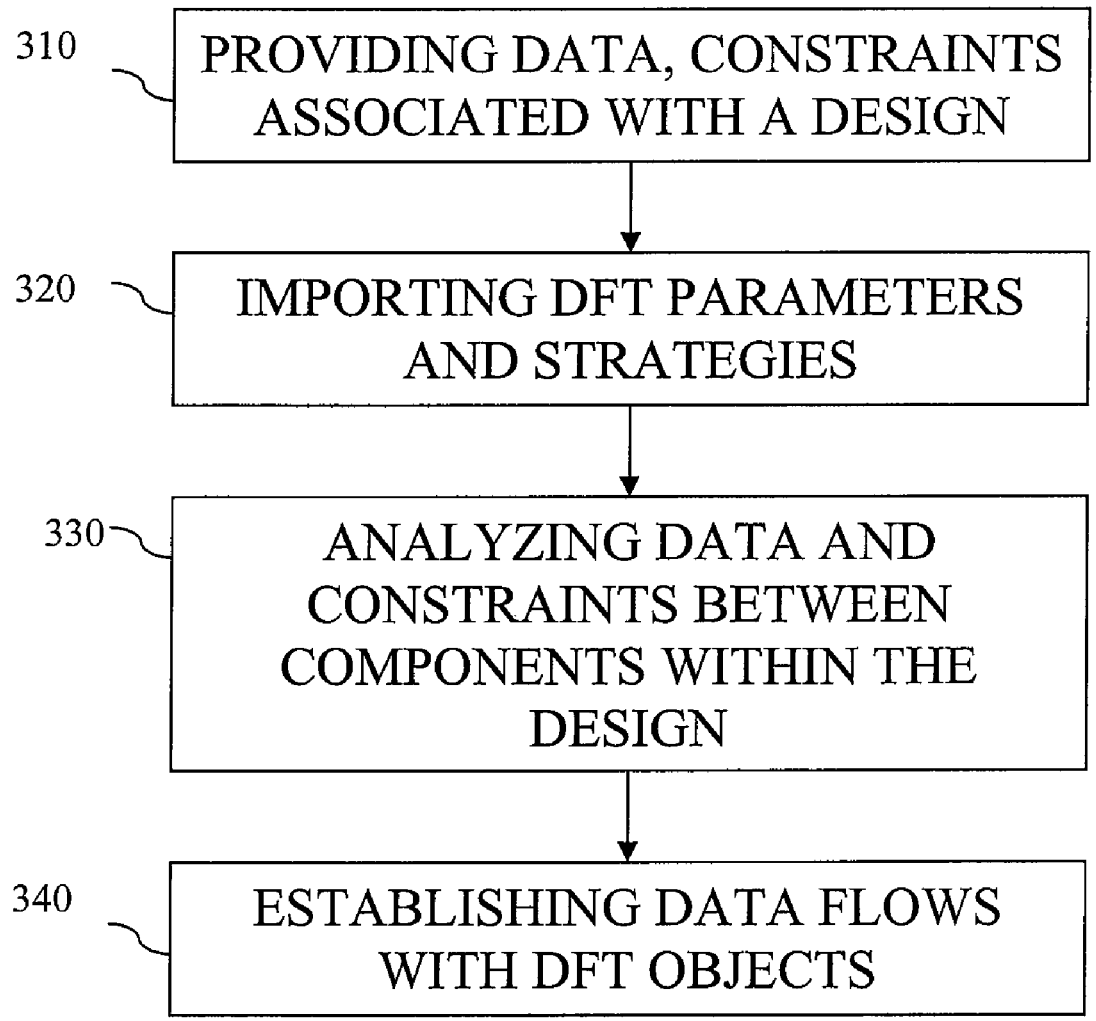
FIG. 3A illustrates another flow diagram according to an embodiment of the present invention.

FIG. 3A illustrates a flow diagram for creating dataflow of logic design including DFT considerations. The flow diagram 300 is an example of the process that may occur in assessing logic of 210.

In one embodiment, the process receives design data and constraints associated with an electronic design 310. In other embodiments, the electronic design may be a previously created design or a new design. At 320, DFT parameters and strategies associated with the DFT object are also imported.

At 330, the design data, constraints and DFT parameters and strategies are analyzed to determine the types, quantities, complexity, relationships, etc. between components in the electronic design. The electronic design also includes DFT objects. The DFT object includes parameters that allow for customization of the prototype DFT models. The result of this analysis may be a dataflow diagram corresponding to the design logic of the components including the DFT objects. This analysis may be performed by analyzing and partitioning the design logic, and then mapping the design logic to anticipate the components. Relationships would be defined between the components to establish the data flows. The defined relationships results in a dataflow diagram, which may include multiple DFT objects corresponding to the test structure components.

At 340, the dataflow diagram is established with the DFT objects as part of the dataflow diagram. The dataflow diagram is the functional representation of the logic of the electronic design. In one embodiment, this design includes test structure logic which assists in the testing of the electronic circuit.

Figure 3B:
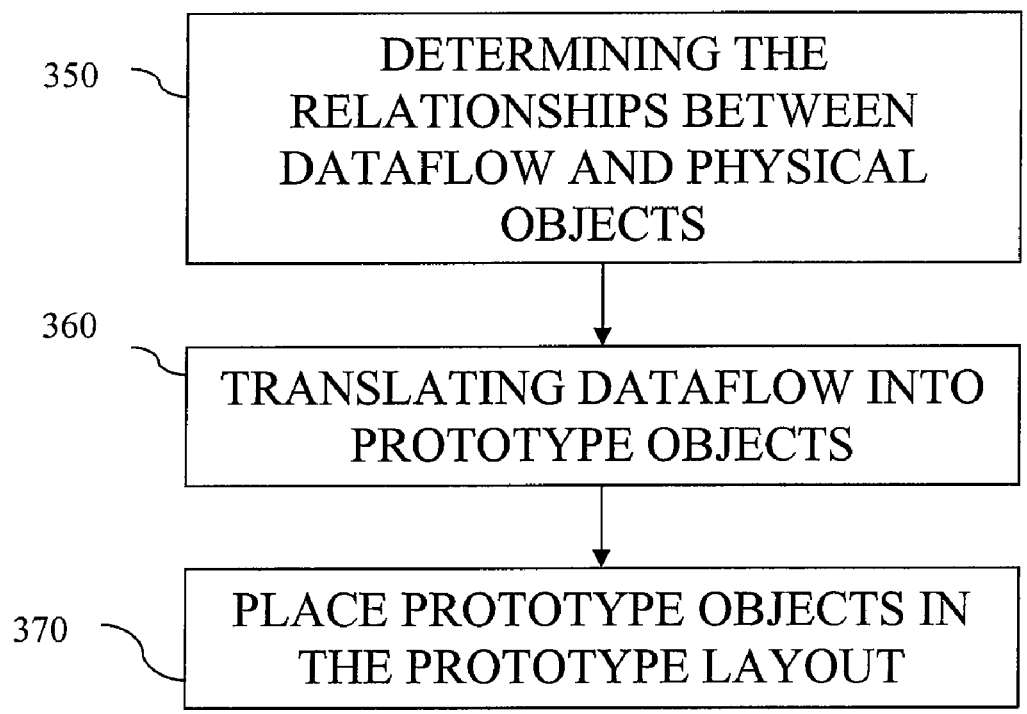
FIG. 3B illustrates another flow diagram according to an embodiment of the present invention.

FIG. 3B illustrates another flow diagram for translating and placing physical objects into a prototype layout from the dataflow diagram. The flow diagram 305 is an example of a process that may occur in projecting of the test structure logic into physical objects of the prototype layout of 210.

At 350, the relationship between the dataflow and the physical objects are determined. In some embodiments, how the components are mapped to prototype layout is determined. In one embodiment, the components are stored in a database. In some embodiments, the DFT object parameters are used to map to the DFT cells using the prototype DFT models database/library 150. The DFT models database/library 150 may, for example, provide the netlist of the prototype layout design. In other embodiments, an openaccess (OA) database provides the relationships and mappings. In other embodiments, the model may be a generalized DFT cell and the parameters may customize the model to create the cell with the desired characteristics. Any mapping strategies may be used, but the mappings have to be determined in order to perform the translation.

At 360, the dataflow is translated into physical objects and place as a prototype layout using the relational and mapping information. In one embodiment, the translation may involve receiving from a database/library the layout designs to be inserted on the prototype layout. In another embodiment, netlists or other information may be used to generate the prototype layout. In other embodiments, the DFT object includes parameters that allows for customization of the DFT models and places the customized DFT models as the DFT cell into the floor plan layout. Any conventional floor planning tool may be used to generate a floor plan from the dataflow diagram.

At 370, test structures and other components are placed on the electronic design layout as determined by the translating process. Any conventional placing tools may be used to place the layout as desired.

In one embodiment, an abstraction process may be used in order to generate the prototype DFT models from the test structures. The abstraction process creates the prototype DFT models database/library 150 for the designers to access. In some embodiments, the prototype DFT models define certain testing structures by its physical characteristics. In other embodiments, the prototype DFT models are defined by a netlist. In other embodiments, a generic prototype DFT model is used for each type of testing structure. Any process to represent the testing structures may be used.

Figure 4:
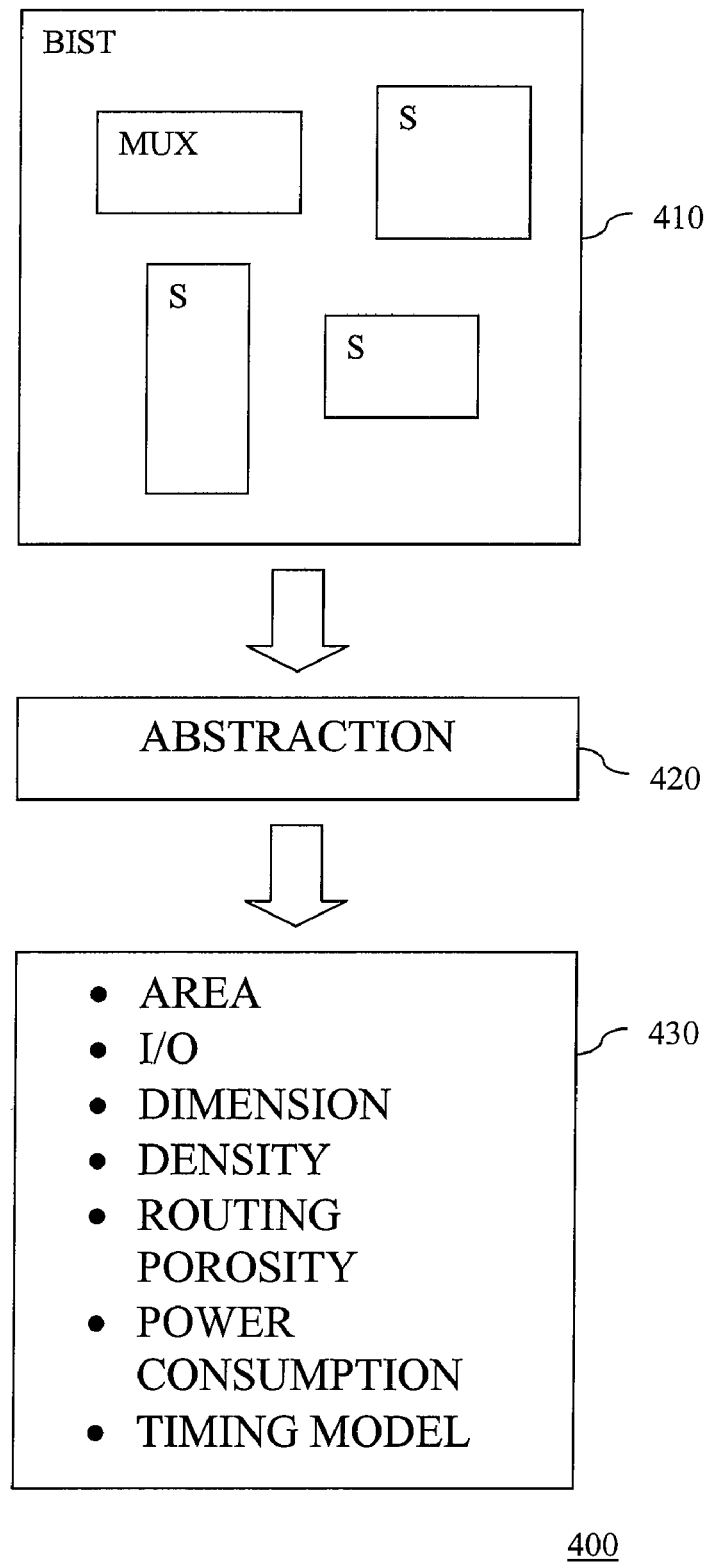
FIG. 4 depicts a modeling example according to an embodiment of the present invention.

FIG. 4 depicts a modeling example for representing a built-in self-test (BIST) as a prototype DFT model according to an embodiment of the present invention. In one embodiment, the test structure 410 is a built-in self-test (BIST). An abstraction is performed on the BIST 420. The result is a BIST prototype model 430. In some embodiments, the BIST prototype model is stored in the prototype DFT models database/library 150.

The design of the BIST 410 may include a plurality of components such as standard cells (S) and multiplexers (MUX). Other kinds of components may also be included. An abstraction process 420 is performed on the BIST in order to generate the prototype DFT model of the test structure. The resulting model 430 may be utilized in a dataflow diagram. In one embodiment, the prototype model information may include information such as the area, density, dimension, input/output, power consumption, timing model and routing porosity of the DFT structure. In some embodiments, the resulting model is stored in a prototype database/library 150 to provide modeling information to the prototype layout. In other embodiments, the prototype database/library may be located in a remote location.

Figure 5:
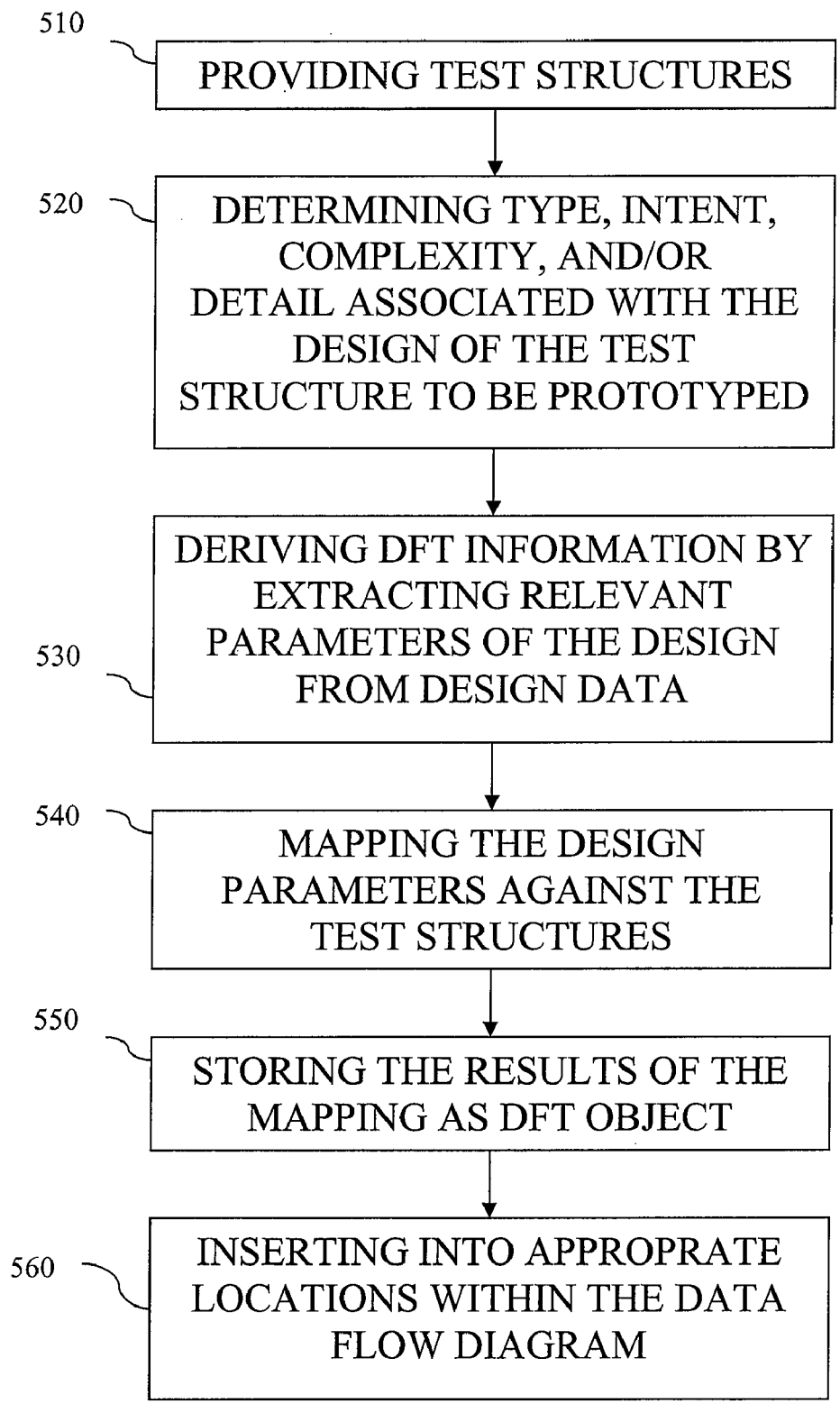
FIG. 5 illustrates a flow diagram of the modeling example according to an embodiment of the present invention.

FIG. 5 illustrates a flow diagram of the modeling example of FIG. 4. At 510, test structures are provided for models prototyping. In some embodiments, the test structures are selected to be used in a test suite. In other embodiments, all possible test structures are included. Any combination of desired test structures may be modeled for storing in the prototype DFT models database/library 150.

The underlying design data of the test structure is used and analyzed to determine the type, intent, complexity, quantity, and/or detail associated with the design of the test structure to be prototyped, 520. In some embodiments, the DFT objects of the dataflow diagram may correspond to test structure. In some embodiments, a database or library is maintained of DFT information. The DFT parameters and strategy 120 includes details of the strategies and parameters of different possible test structure implementations. In some embodiments, the database/library contains implementation details for test structures associated with memory built-in test-structure (MBIST) and test compression structures. The specific test structures that would be prototyped for the design may depend upon the type and/or intent of the design under consideration, as well as the complexity and detail associated with the design.

In some embodiments, the DFT information is derived by extracting relevant properties of the design from design data 530. In other embodiments, the DFT properties are provided by the designer and/or tester. Any procedures may be used to analyze and determine the properties of the design. The properties may be stored in a prototype DFT models database/library 150. This process is repeater for other test structure designs. The other designs are also stored in the prototype database/library 150. In some embodiments, the prototype DFT models database/library 150 provides a way for easy access of DFT models in order for the translation of the dataflow logic into geometric designs to be placed in the prototype layout.

The prototype DFT models database/library 150 is accessible in order to improve the efficiency of the design process. At 540, the design parameters may be mapped against the prototype models database/library 150 of test structures. In some embodiment, the parameter information of the DFT 120 may be used to formulate a dataflow diagram and allow the analysis of the dataflow diagram to include the DFT objects. In one embodiment, the complexity of the design data can be estimated by counting the number of registers within the design. This complexity parameter can then be used in conjunction with the database to determine the number and type of test structures to be implemented for prototyping.

At 550, the result of this analysis may be stored as a set of DFT objects. At 560, the DFT objects are inserted into the appropriate locations within the dataflow diagrams. The results of this analysis may provide feedback to improve the design of the electronic device.

The invention provides early prototyping of test structures. This allows early identification of the impact of those structures upon the design. Any changes or improvements can therefore be made in a more efficient and expeditious manner.

The embodiments can be used for any type of design activities, including hardware design, software design, and designs including both hardware and software such as hardware/software co-design activities. For example, some embodiments of the invention can be applied to the design of embedded software and systems, which includes graphical processors, central processing units, computers, as well as any other systems that include embedded software.

Figure 6:
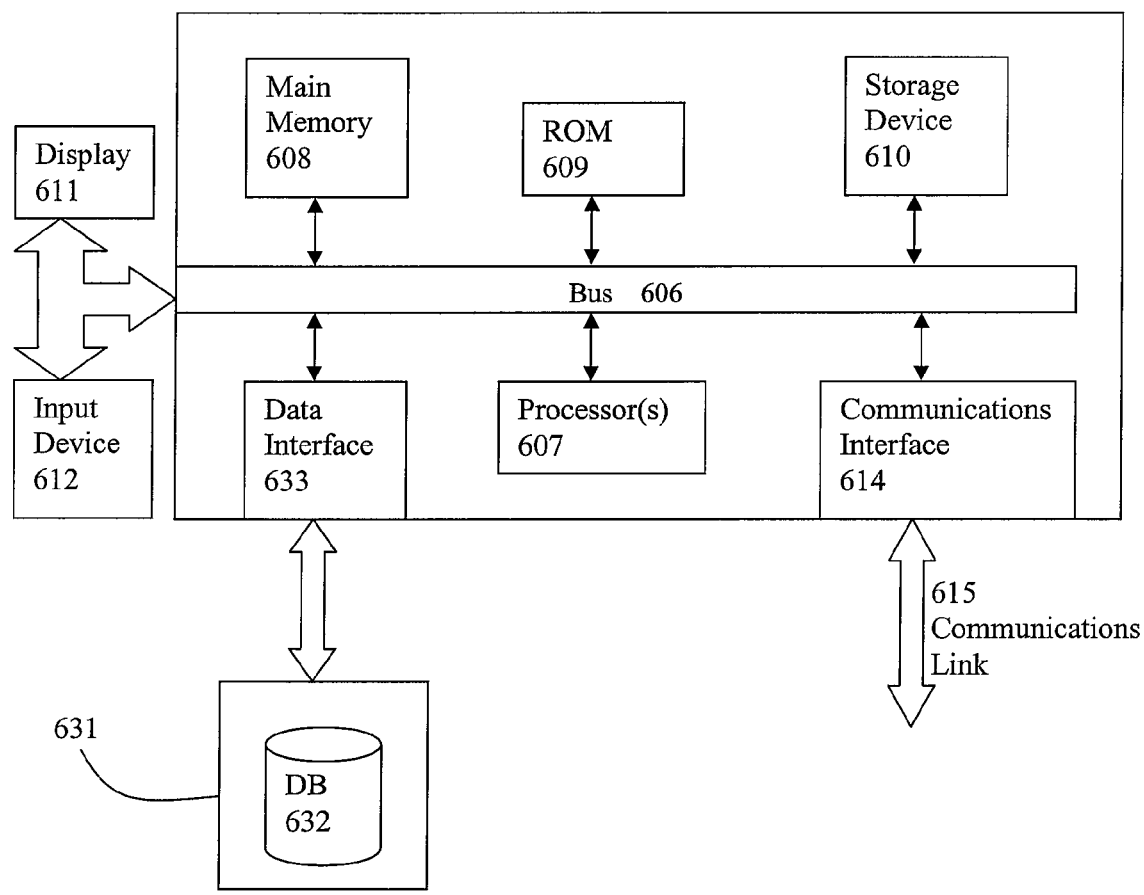
FIG. 6 depicts a computerized system on which a method for verification based on rules and models can be implemented.

FIG. 6 depicts a computerized system on which a method for early stage prototyping of electronic designs can be implemented. The execution of the sequences of instructions required to practice the embodiments may be performed by a computer system 600 as shown in FIG. 6.

In an embodiment, execution of the sequences of instructions is performed by a single computer system 600. According to other embodiments, two or more computer systems 600 coupled by a communication link 615 may perform the sequence of instructions in coordination with one another. Although a description of only one computer system 600 will be presented below, however, it should be understood that any number of computer systems 600 may be employed to practice the embodiments.

A computer system 600 according to an embodiment will now be described with reference to FIG. 6, which is a block diagram of the functional components of a computer system 600. As used herein, the term computer system 600 is broadly used to describe any computing device that can store and independently run one or more programs.

Each computer system 600 may include a communication interface 614 coupled to the bus 606. The communication interface 614 provides two-way communication between computer systems 600. The communication interface 614 of a respective computer system 600 transmits and receives electrical, electromagnetic or optical signals, which include data streams representing various types of signal information, e.g., instructions, messages and data. A communication link 615 links one computer system 600 with another computer system 600. For example, the communication link 615 may be a LAN, in which case the communication interface 614 may be a LAN card, or the communication link 615 may be a PSTN, in which case the communication interface 614 may be an integrated services digital network (ISDN) card or a modem, or the communication link 615 may be the Internet, in which case the communication interface 614 may be a dial-up, cable or wireless modem.

A computer system 600 may transmit and receive messages, data, and instructions, including program, i.e., application, code, through its respective communication link 615 and communication interface 614. Received program code may be executed by the respective processor(s) 607 as it is received, and/or stored in the storage device 610, or other associated non-volatile media, for later execution.

In an embodiment, the computer system 600 operates in conjunction with a data storage system 631, e.g., a data storage system 631 that contain a database 632 that is readily accessible by the computer system 600. The computer system 600 communicates with the data storage system 631 through a data interface 633. A data interface 633, which is coupled to the bus 606, transmits and receives electrical, electromagnetic or optical signals, which include data streams representing various types of signal information, e.g., instructions, messages and data. In embodiments, the functions of the data interface 633 may be performed by the communication interface 614.

Computer system 600 includes a bus 606 or other communication mechanism for communicating instructions, messages and data, collectively, information, and one or more processors 607 coupled with the bus 606 for processing information. Computer system 600 also includes a main memory 608, such as a random access memory (RAM) or other dynamic storage device, coupled to the bus 606 for storing dynamic data and instructions to be executed by the processor(s) 607. The main memory 608 also may be used for storing temporary data, i.e., variables, or other intermediate information during execution of instructions by the processor(s) 607.

The computer system 600 may further include a read only memory (ROM) 609 or other static storage device coupled to the bus 606 for storing static data and instructions for the processor(s) 607. A storage device 610, such as a magnetic disk or optical disk, may also be provided and coupled to the bus 606 for storing data and instructions for the processor(s) 607.

A computer system 600 may be coupled via the bus 606 to a display device 611, such as, but not limited to, a cathode ray tube (CRT), for displaying information to a user. An input device 612, e.g., alphanumeric and other keys, is coupled to the bus 606 for communicating information and command selections to the processor(s) 607.

According to one embodiment, an individual computer system 600 performs specific operations by their respective processor(s) 607 executing one or more sequences of one or more instructions contained in the main memory 608. Such instructions may be read into the main memory 608 from another computer-usable medium, such as the ROM 609 or the storage device 610. Execution of the sequences of instructions contained in the main memory 608 causes the processor(s) 607 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 607. Such a medium may take many forms, including, but not limited to, non-volatile, and volatile. Non-volatile media, i.e., media that can retain information in the absence of power, includes the ROM 609, CD ROM, magnetic tape, and magnetic discs. Volatile media, i.e., media that can not retain information in the absence of power, includes the main memory 608. Transmission media includes coaxial cables, copper wire and fiber optics, including the wires that comprise the bus 606.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than in a restrictive sense.

What is claimed is:

1. A method for prototyping of an electronic design comprising:
   assessing, by using a processor, a design logic associated with test structure parameters during the prototyping of the electronic design such that a dataflow diagram is established with the design logic of the electronic design based at least in part upon the test structure parameters, wherein the dataflow diagram is a functional representation of the design logic of the electronic design;
   translating the dataflow of the design logic into a prototype test structure for a prototype layout based at least in part upon a test structure model such that the design logic associated with the prototype test structure is projected into a physical object of the prototype layout;
   determining an impact of the prototype test structure upon the prototype layout, wherein the assessing, translating, and determining are performed in an architectural planning stage of the electronic design; and
   storing a result of the impact in a volatile or non-volatile computer-usable medium or displaying the result of the impact on a display device such that the result is provided to assist in design decisions.

2. The method of claim 1, wherein one or more of the test structure models correspond to a standardized test structure.

3. The method of claim 2, wherein the standardized test structure is customized into a desired prototype test structure by customizing the standardized test structure with a plurality of parameters and strategies based on type, intent, complexity and/or details associated with the test structure.

4. The method of claim 3, wherein the customizing further comprises extracting relevant parameters and mapping the parameters against the prototype test structure.

5. The method of claim 1, further comprising providing the result as feedback to update design information.

6. An apparatus for prototyping of an electronic design comprising: a processor programmed for:

assessing, by using a processor, a design logic associated with test structure parameters during the prototyping of the electronic design such that a dataflow diagram is established with the design logic of the electronic design based at least in part upon the test structure parameters, wherein the dataflow diagram is a functional representation of the design logic of the electronic design;

translating the dataflow of the design logic into a prototype test structure for a prototype layout based at least in part upon a test structure model such that the design logic associated with the prototype test structure is projected into a physical object of the prototype layout;

determining an impact of the prototype test structure upon the prototype layout wherein the assessing, translating, and determining are performed in an architectural planning stage of the electronic design; and a volatile or non-volatile computer-usable medium for storing a result of the impact in or a display device for displaying the result of the impact such that the result is provided to assist in design decisions.

7. The apparatus of claim 6, wherein the test structure model corresponds to a standardized test structure.

8. The apparatus of claim 7, wherein the standardized test structure is customized into a desired prototype test structure by customizing the standardized test structure with a plurality of parameters and strategies based at least in part upon type, intent, complexity and/or details associated with the test structure.

9. The apparatus of claim 8, wherein the customizing further comprises extracting relevant parameters and mapping the parameters against the prototype test structure.

10. The apparatus of claim 6, wherein the processor is further programmed for providing the result as feedback to update design information.

11. A computer program product that includes a volatile or non-volatile computer-usable medium, the computer-usable medium comprising instructions which, when executed by a processor, causes the processor to execute a process for prototyping of an electronic design, the process comprising:

assessing, by using a processor, a design logic associated with test structure parameters during the prototyping of the electronic design such that a dataflow diagram is established with the design logic of the electronic design based at least in part upon the test structure parameters, wherein the dataflow diagram is a functional representation of the design logic of the electronic design;

translating the dataflow of the design logic into a prototype test structure for a prototype layout based at least in part upon a test structure model such that the design logic associated with the prototype test structure is projected into a physical object of the prototype layout;

determining an impact of the prototype test structure upon the prototype layout wherein the assessing, translating, and determining are performed in an architectural planning stage of the electronic design; and storing a result of the impact or displaying the result of the impact on a display device such that the result is provided to assist in design decisions.

12. The product of claim 11, wherein one or more of the test structure model corresponds to a standardized test structure.

13. The product of claim 12, wherein the standardized test structure is customized into a desired prototype test structure by customizing the standardized test structure with a plurality of parameters and strategies based at least in part upon type, intent, complexity and/or details associated with the test structure.

14. The product of claim 13, wherein the customizing further comprises extracting relevant parameters and mapping the parameters against the prototype test structure.

15. The product of claim 11, further comprising providing the result as feedback to update design information.

\* \* \* \* \*